United States Patent [19]

Razeghi et al.

[11] Patent Number: 5,807,765
[45] Date of Patent: Sep. 15, 1998

[54] PROCESSING OF SB-BASED LASERS

[75] Inventors: Manijeh Razeghi, Wilmette; Jacqueline E. Diaz, Evanston, both of Ill.

[73] Assignee: Northwestern University, Evanston, Ill.

[21] Appl. No.: 870,986

[22] Filed: Jun. 6, 1997

[51] Int. Cl.$^6$ .................................................. H01L 21/20
[52] U.S. Cl. .............................. 438/38; 438/46; 438/47; 257/76
[58] Field of Search ................................ 438/38, 46, 47; 257/76

[56] References Cited

U.S. PATENT DOCUMENTS 5,726,462   3/1998   Spahn et al. ............................ 257/76

OTHER PUBLICATIONS

Choi et al., GaInAsSb–AiGaAsSb Tapered Lasers Emitting at 2 um, Oct., 1993, IEEE *Photonics Technology Letters*, vol. 5, No. 10, pp. 1117–1119.

Choi et al., High–power multiple–quantum–well GaInAsSb/ALGaAsSb diode lasers emitting at 2.1 um with low threshold current density, Sep., 1992, Appl. Phys. Lett. 61 (10), pp. 1154–1156.

Eglash et al., Efficient GaInAsSb/AIGaAsSb diode lasers emitting at 2.29 um, Sep. 24, 1990, Appl Phys. Lett. 57(13), pp. 1292–1294.

Choi et al., Double–heterostructure diode lasers emitting at 3 um with a metastable GaInAsSb active layer and AIGaAsSb cladding layers, May 9, 1994, Appl. Phys. Lett 64(19), pp. 2474–2476.

Choi et al., 3.9um in AsSb/AIAsSb double–heterostrructure diode lasers with high output power and improved temperature characteristics, Oct. 31, 1994, Appl. Phys. Lett. 65(18), pp. 2251–2253.

Kurtz et al., Pseudomorphic In AsSb multiple quantum well injection laser emitting at 3.5um, Mar. 4, 1996, Appl. Phys. Lett. 68(10), pp. 1332–1334.

Poppy et al., High power In AsSb/InAsSbP double heterostructure laser for continous wave operation at 3.6 um, May 13, 1996, Appl Phys. Lett. 68(20), pp. 2790–2792.

Kurtz et al., Midwave (4um) infrared lasers and light–emitting diodes with biaxially compressed InAsSb active regions, Feb. 14, 1994, Appl. Phys. Lett. 64(7), pp. 812–814.

C. Deshpandey et al., "Evaporation Processes", in Thin Film Processes II, edited by Vossen et al., Academic Press, pp. 112–129 (no month given), 1991.

*Primary Examiner*—Charles L. Bowers, Jr.
*Assistant Examiner*—Keith Christianson
*Attorney, Agent, or Firm*—Welsh & Katz, Ltd.

[57] ABSTRACT

A method for passivating a III-V semiconductor surface with $Al_2O_3$ is disclosed. Sb-based semiconductor lasers may be etched with a solution of $HCl:HNO_3:H_2O$ for a more uniform surface.

5 Claims, 3 Drawing Sheets

PHOTORESIST LAYER

UV-LIGHT

▨ PHOTORESIST LAYER    ▥ InAs LAYER
▧ METAL LAYER    ▦ ACTIVE LAYER

PROCESSING OF SB-BASED LASERS

This invention is made with government support under Grant DAAH04-951-0343 awarded by the ARPA/United States Army. The government has certain rights in the invention.

This application relates to semiconductor III-V alloy DH and SCH structures and to a method of preparing such structures for use in mid-infrared lasers.

BACKGROUND OF THE INVENTION

The growth of semiconductor III-V compounds by chemical vapor deposition (CVD) using organometallics and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III-V alloys. The process requires only one high-temperature zone for the in situ formation and growth of the semiconductor compound directly on a heated substrate.

Low pressure (LP-) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grow an InAsSb/InAsSbP alloy on an InAs substrate. InAsSbP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD and MOMBE.

While each of the above processes are viable, certain disadvantages exist; for example, LPE experiences growth problems with InAsSbP alloys and potential nonuniform growth as well as melt-back effect. Molecular-beam epitaxy is a very expensive and complex process, and difficulties have been reported with p-type doping and with the growth of phosphorus-bearing alloys. Vapor-phase epitaxy disadvantages include potential for hillock and haze formation and interfacial decomposition during the preheat stage.

The technique of LP-MOCVD is well adapted to the growth of the entire composition range of InAsSbP layers of uniform thickness and composition on InAs substrates. This results first from the ability of the process to produce abrupt composition changes and second from the result that the composition and growth rate are generally temperature independent. It is a versatile technique, numerous starting compounds can be used, and growth is controlled by fully independent parameters.

The high quality of double heterostructure laser diodes based on the InAsSb/InAsSbP alloy on InAs substrate (100) grown by MOCVD is known which shows low threshold current density and a high output power. However, for the InAsSb/InAsSbP system it is important to have a system which can be reliably connected to other components of the device in which the laser is situated. The most common film used in passivation of III-V semiconductor devices is $SiO_2$ for its simplicity in chemical properties. However, the properties of $SiO_2$ film often leads to poor uniformity and film adhesion problems during processing.

Wet chemical etching methods are being used increasingly in the fabrication if III-V semiconductor lasers for mesa formation, pin holes and other pattern transfer steps. Most devices use dry etching techniques to obtain vertical sidewalls and deep mesas. Dry etching offers many advantages over wet etching for device fabrication, including better dimensional control and superior uniformity. The disadvantages are the much higher capitol equipment cost and, to a lesser extent, the question of damage in the semiconductor surface.

In semiconductor lasers, most applications often require lasers to operate in a single mode, generate a relatively high power condition or to provide special lasing characteristics. Lasers of this type are fabricated by specific design structure which often requires the etching of multiple semiconductor layers. The fabrication of index guided InAsSbP/InAsSb/InAs lasers is usually complicated and requires several stages.

SUMMARY OF THE INVENTION

An object, therefore, of the invention is the preparation of high quality interfaces between the semiconductor surface and the remainder of the laser structure.

A further object of the subject invention is the deposition of a passivating and insulating surface on a III-V semiconductor surface.

A still further object of the subject invention is an improved method of etching semiconductor surfaces.

These and other objects are attained by the subject invention wherein the deposition of passivating and insulating films onto a III-V semiconductor surface has been a major importance in semiconductor lasers to provide protection on which interconnection can be made. Some of these films can be patterned for use as diffusion or ion implantation masks. In semiconductor lasers, $SiO_2$ is the most common passivation film that is used to provide better current distribution along the stripe metal contact and to reduce current leakages along deep mesa sidewalls. However, it has been found that $Al_2O_3$ may be used as a passivation film in Sb-based systems. The primary consideration of using this dielectric film in InAsSbP/InAsSb/InAs mid-infrared lasers is to improve the performance of the lasers by improving the ability to bond single lasers and laser array bars p-side down on a copper heatsink. Deposition of $Al_2O_3$ films may be carried out in an electron-beam evaporator.

InAsSbP epilayers in InAsSbP/InAsSb/InAs lasers may be etched for mesa formation, holes and other pattern transfer steps by first etching in a $HCl:HNO_3$ (2:1) solution. A second step of immersion in a second solution of $HCl:HNO_3:H_2O(2:1:0.1)$ is then conducted for 2–7 seconds at room temperature. The result is a smoother and more uniform surface.

DESCRIPTION OF THE DRAWINGS

These and other objects are attained, together with additional features contributing thereto and advantages accruing therefrom will be apparent from the following detailed description of various embodiments of the invention when used in conjunction with the accompanying drawings, wherein.

DETAILED DESCRIPTION OF THE INVENTION

A III-V semiconductor structure is prepared based on an Sb-based composition, as known in the art. One example would be a double heterostructure of InAsSbP/InAsSb/InAs. The quaternary confinement layer of InAsSbP may be passivated with $Al_2O_3$ beginning with an organic cleaning (trichloroethane, acetone and methanol) followed by a 10% hydrofluoric dip for several seconds. The formation of a 100 $\mu$m mesa is accomplished by using photolithography technology on the InAs cap layer. For the current to be confined along a 100 $\mu$m stripe contact, a wet chemical etch of $H_2SO_4:H_2O_2:H_2O$ (1:1:20) is used for one minute to etch approximately 0.3–0.4 $\mu$m of $p^+$-InAs. A schematic cross-section of a processing sequence for a 100 $\mu$m broad-area laser is shown in FIG. 1. Upon the formation of 100 $\mu$m mesas over a semiconductor wafer, the preparation of the $Al_2O_3$ deposition is prepared. Following the etching of the $p^+$-InAs layer and without removing the resist film, the laser structures or wafers are inserted into an electron-beam evaporator. Using the process parameters set forth in Table 1, a lift-off evaporation of $Al_2O_3$ (~800 Å–1000 Å) is deposited over the entire surface of the wafer. A hot photoresist stripper bath is then used to lift off selected areas of the $Al_2O_3$ film from the surface of the resist film.

TABLE 1

| Process Parameters | | Results | |
| --- | --- | --- | --- |
| material | $Al_2O_3$ | deposition rate | 2.0 A/s–4.0 Å/s |
| carrier gas | none | refractive index | 1.6 |
| substrate temperature | 20 C. | | |
| pressure | $2 \times 10^{-6}$ | | |
| beam-sweep frequency | 9.5 Hz | | |
| film thickness | ~0.08 $\mu$mm–1.0$\mu$m | | |

A 200 $\mu$m TiPt/Au (400 Å/500 Å/1200 Å) metal contact pad is formed over the 100 $\mu$m mesa structure to provide electrical contact, followed by a three minute 300° C. annealing. The composition of the n-InAs contact is composed of AuGe (700 Å)-Ni (350 Å)-Au (1200 Å) which provides low contact resistance to the p-contact.

Figure 1A:
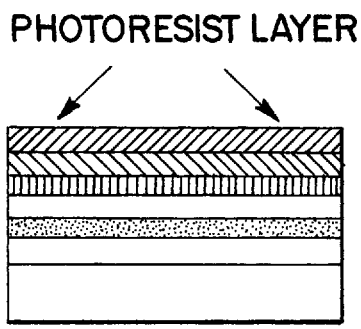
FIGS. 1a–1d are schematic representations of the steps involved in preparing a InAsSbP/InAsSb/InAs structure and then passivating according to the subject invention.
Figure 1B:
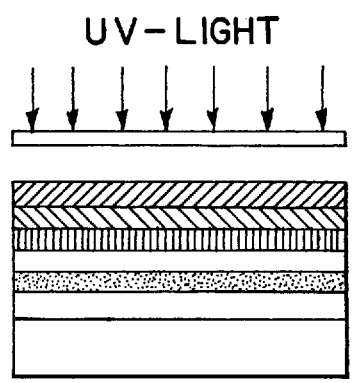
Figure 1C:
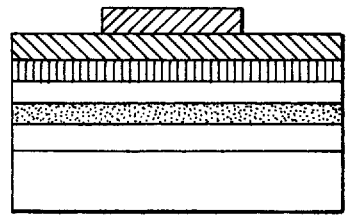
Figure 1D:
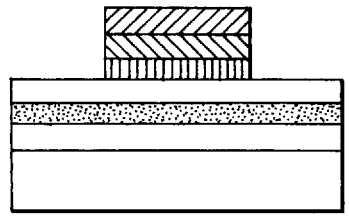
Figure 2:
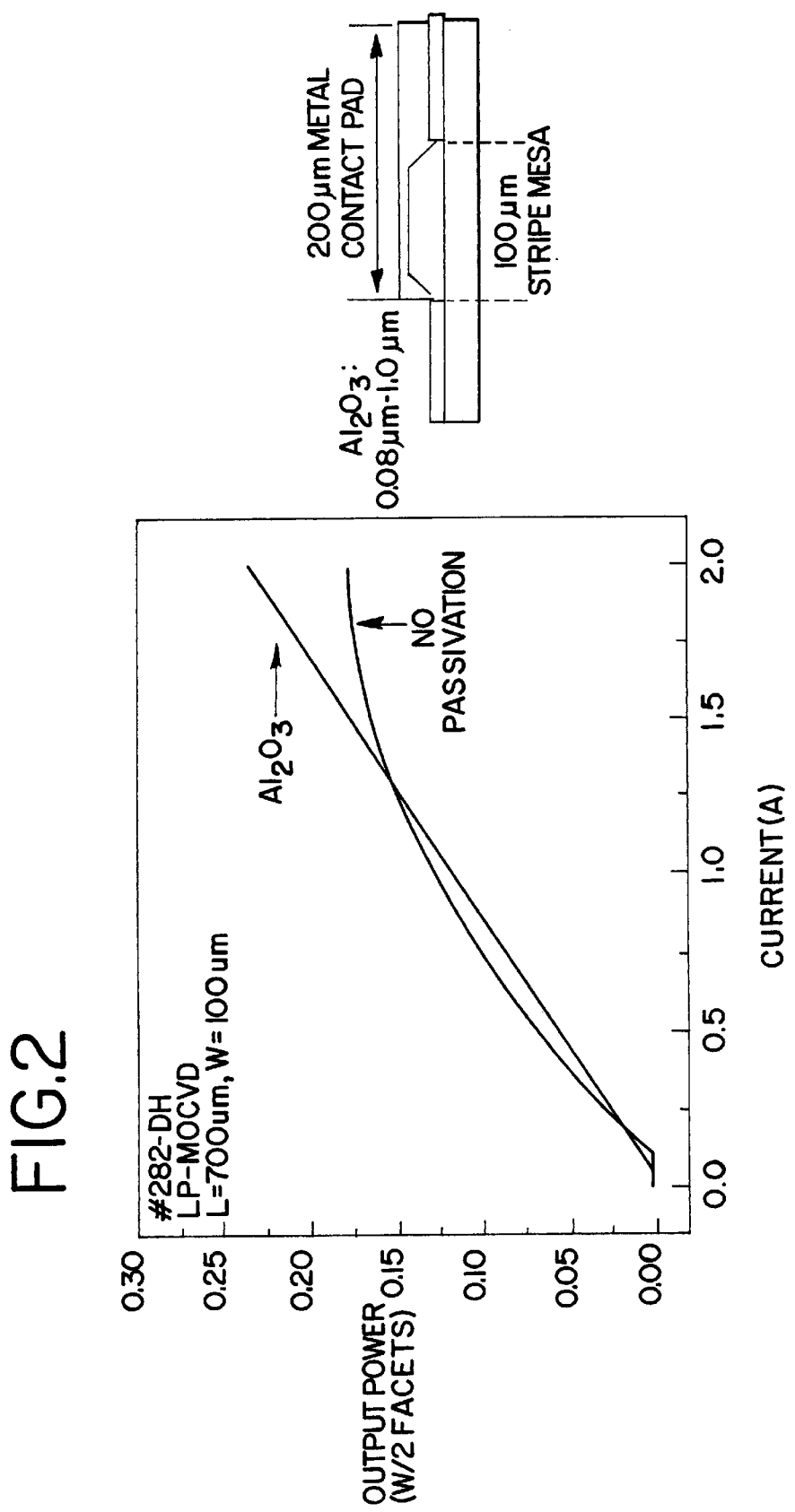
FIG. 2 is a graphic comparison of a double heterostructure InAsSbP/InAsSb/InAs with and without passivation.
Figure 3:
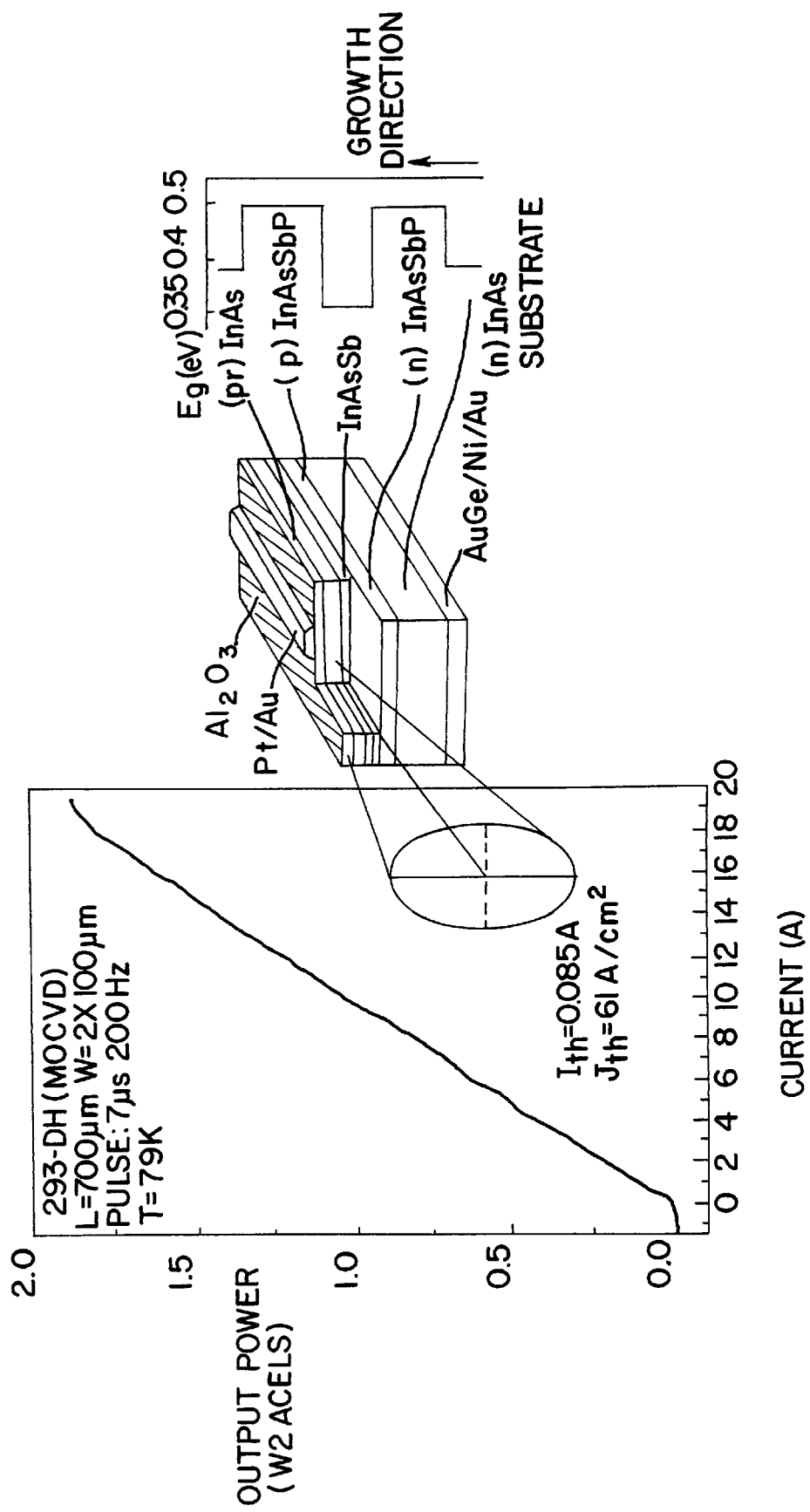
FIG. 3 is a graphic representation of the light-current characteristics of a DH InAsSbP/InAsSb/InAs laser with passivation.

FIG. 2 demonstrates the superiority of the subject invention technology with InAsSbP/InAsSb/InAs lasers. The InAsSbP/InAsSb/InAs lasers with the subject invention resulted in better performance in output power and better stability as compared to lasers with no passivation as shown in FIG. 2. Passivation of the semiconductor surface has been a key issue to ensure current distribution along the stripe contact area of the laser; and the ability to bond single or laser array bars p-side down. During the characterization of InAsSbP/InAs lasers, effects of current leakages and poor heat distribution for various lasers were recognized as critical problems and various efforts to passivate DH and MQW lasers were made. Single lasers with $Al_2O_3$ passivation can sustain high output powers of 800 mW per two facets at 79K when bonded p-side down. FIG. 3 demonstrates the light-current characteristics of DH InAsSbP/InAsSb/InAs laser array bar using $Al_2O_3$ passivation outside the 100 $\mu$m contact area (p-side down). Peak output power up to 2 W (from two facets) are obtained from DH laser bars with stripe width of 2×100 $\mu$m and cavity length of 700 $\mu$m for emitting wavelength of 3.2 $\mu$m at 79K.

As stated above, with traditional methods of etching utilizing a 2:1 mixture of $HCl:HNO_3$, there is exhibited some variation of uniformity with a somewhat roughened surface having etch irregularities on the surface. In the method of the subject invention, after the initial etching step with the 2:1 solution of $HCl:HNO_3$, an additional step is performed. This step comprises immersing the wafers into a second etchant diluted with water to a concentration of 2:1:0.1 ($HCl:HNO_3,:H_2O$) for 2–7 seconds, preferably for 3 seconds. By so diluting with small portions of water, the InAsSb surface of the water resulted in a smoother and uniform surface.

Table 2 shows the differences between the prior art solution (1), the solution of the subject invention (2) and a more dilute solution (3)

TABLE 2

| Solution | Material | Ratio (ml) | Results |
| --- | --- | --- | --- |
| 1 $HCl:HNO_3$ | InAs, InAsSb | 2:1 | isotropic etch, small variation of uniformity for InAs/InAsSb |
| 2 $HCl:HNO_3:H_2O$ | InAs, InAsSb | 2:1:0.1 | mirror-like surface, good uniformity across water; good isotropic etch |
| 3 $HCl:HNO_3:H_2O$ | InAsSbP/InAsSbP/InAs | 2:1:1 | smooth surface, etch irregularities between InAs/InAsSbP/InAsSb |

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims. Various features of the invention are set forth in the following claims.

I claim:

1. A method of passivating Sb-based semiconductor laser structures, comprising depositing a passivation layer of $Al_2O_3$ on the whole of said semiconductor laser structure.

2. The method of claim 1 including the steps of:

cleaning the Sb-based laser with an organic solvent and an HF bath;

forming a mesa with photolithography on a cap layer;

chemically etching the cap layer;

depositing a passivation layer of $Al_2O_3$ at 20° C. under $2\times10^{-6}$ atm at 9.5 Hz by an electron beam evaporator, forming a metal contact pad on said mesa and annealing;

cleaning the laser structure with an organic solvent and an HF bath;

forming a mesa with photolithography on the cap layer;

chemically etching the cap layer;

depositing a passivation layer of $Al_2O_3$ at 20° C. under $2\times10^{-6}$ atm at 9.5 Hz by an electron beam evaporator over the entire etched laser structure, forming a metal contact pad on said mesa and annealing.

3. The method of claim 1 including the step of depositing $Al_2O_3$ to a thickness of about 800 Å to about 1000 Å.

4. A method of passivating InAsSbP/InAsSb/InAs semiconductor laser structures, comprising the steps of:

cleaning the laser structure with an organic solvent and an HF bath;

forming a mesa with photolithography on the cap layer;

chemically etching the cap layer;

depositing $Al_2O_3$ at 20° C. under $2\times10^{-6}$ atm at 9.5 Hz by an electron beam evaporator, forming a metal contact pad on said mesa and annealing.

5. A method of forming III-V semiconductor lasers including etching InAs, InAsSb and InAsSbP layers by the steps of immersing a III-V semiconductor structure into a first bath of $HCL:HNO_3$ (2:1), rinsing and then immersing said structures into a second bath of $HCl:HNO_3:H_2O$ (2:1:0.1) for about 2 to about 7 seconds.

* * * * *